(12) United States Patent
Szyszka et al.

(10) Patent No.: US 7,763,150 B2
(45) Date of Patent: Jul. 27, 2010

(54) METHOD AND DEVICE FOR MAGNETRON SPUTTERING

(75) Inventors: Bernd Szyszka, Braunschweig (DE); Andreas Pflug, Braunschweig (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 835 days.

(21) Appl. No.: 10/583,124

(22) PCT Filed: Nov. 29, 2004

(86) PCT No.: PCT/EP2004/013532

§ 371 (c)(1),
(2), (4) Date: Jun. 16, 2006

(87) PCT Pub. No.: WO2005/059197

PCT Pub. Date: Jun. 30, 2005

(65) Prior Publication Data

US 2007/0158177 A1  Jul. 12, 2007

(30) Foreign Application Priority Data

Dec. 18, 2003 (DE) ................................ 103 59 508

(51) Int. Cl.
*C23C 14/35* (2006.01)
(52) U.S. Cl. .................... 204/192.13; 204/192.12; 204/298.21; 204/298.22; 204/298.23; 204/298.24
(58) Field of Classification Search ............ 204/298.21, 204/298.22, 298.23, 298.24, 298.03, 192.12, 204/192.13

See application file for complete search history.

(56) References Cited

U.S. PATENT DOCUMENTS

| | | | |
|---|---|---|---|
| 4,866,032 A | 9/1989 | Fujimori et al. | |
| 5,320,729 A * | 6/1994 | Narizuka et al. | 204/298.13 |
| 5,338,422 A * | 8/1994 | Belkind et al. | 204/192.12 |
| 5,384,021 A | 1/1995 | Thwaites | |
| 5,405,517 A * | 4/1995 | Lampkin | 204/192.12 |
| 5,558,750 A | 9/1996 | Szczyrbowski | |
| 5,814,195 A * | 9/1998 | Lehan et al. | 204/192.12 |
| 2002/0092766 A1* | 7/2002 | Lampkin | 204/298.22 |

FOREIGN PATENT DOCUMENTS

DE  4418906  12/1995

(Continued)

OTHER PUBLICATIONS

Baranov et al., "In Situ X-Ray Reflectivity For Thin-Film Deposition Monitoring and Control," *Solid State Technology*, vol. 42, No. 5, May 5, 1999, pp. 53, 55-56, and 58.

(Continued)

*Primary Examiner*—Rodney G McDonald
(74) *Attorney, Agent, or Firm*—Greenblum & Bernstein, P.L.C.

(57) ABSTRACT

A method and device for magnetron sputtering are provided. A magnetron coating system includes a first coating source and an auxiliary substrate arranged between the first coating source and an area into which a substrate to be coated is to be received. The system also includes a magnetron having a cathode composed of the auxiliary substrate. Additionally, the system includes a device structured and arranged to determine an area density of the auxiliary substrate.

19 Claims, 1 Drawing Sheet

FOREIGN PATENT DOCUMENTS

| | | |
|---|---|---|
| EP | 0291044 | 11/1988 |
| EP | 0537011 | 4/1993 |
| EP | 0795623 | 9/1997 |
| EP | 1232293 | 8/2002 |

OTHER PUBLICATIONS

Vergohl et al., "Real Time Control of Reactive Magnetron-Sputter Deposited Optical Filters By In Situ Spectroscopic Ellipsometry," *Thin Solid Films,* vol. 377-378, Dec. 1, 2000, pp. 43-47.

Vergohl et al., "In Situ Monitoring of Optical Coatings on Architectural Glass and Comparison of the Accuracy of the Layer Thickness Attainable with Ellipsometry and Photometry," *Thin Solid Films,* vol. 392, No. 2, Jul. 30, 2001, pp. 258-264.

J. Affinito et al., *J. Vac. Sci. Technol.* A 2 (1984), p. 1275-1284.

J. Strümpfel, *Prozessstabilisierung beim reaktiven Hochratenzerstäuben mittels optischer Emissionsspektroskopie zur industriellen Herstellung von .Indium-Zinn-Oxidschichten und Titandioxidschichten,* Chemnitz 1991.

S. Berg, *J. Vac. Sci. Technol.* A 10 (1992), p. 1592-1596.

\* cited by examiner

METHOD AND DEVICE FOR MAGNETRON SPUTTERING

CROSS REFERENCE TO RELATED APPLICATIONS

This application is a National Stage entry under 35 U.S.C. §371 of International Application PCT/EP2004/013532, which was filed on Nov. 29, 2004, the disclosure of which is expressly incorporated by reference herein in its entirety. Moreover, this application claims priority to German Patent Application No. DE 103 59 508.2-45.

BACKGROUND OF THE INVENTION

1. Field of the Invention

The invention relates to a method and a device for magnetron sputtering. These technologies are used for depositing functional and finishing layers. Magnetron sputtering technologies are already used on a large scale in industrial production, e.g., for coating architectural glass.

2. Discussion of Background Information

Coating processes in which the coating is composed of several chemical elements, e.g., titanium dioxide, are of particular technical importance. With coating processes of this type, the metallic component is often provided by sputtering a metallic target. The other layer component is introduced into the process chamber in a gaseous form. High coating rates and optimal layer quality can only be achieved with these reactive coating processes when the process is operated in the area of unstable operating points (i.e., in the transition mode). This transition mode is characterized in that the reactive gas feed is large enough to provide a sufficient amount of reactive gas for the layer deposit while at the same time being so low that a contamination of the sputter target with reactive gas is avoided. Particularly with these unstable operating points, constant quality and reproducibility of the coating require the magnetron sputtering system to be operated with the aid of complex control loops.

According to the prior art, magnetron sputtering sources can be influenced through the electric power fed or the reactive gas flow. The necessary control signal can be obtained by measuring different parameters. Thus, for example, it is proposed in EP 1 232 293 B1 to use the harmonic content of the electric parameters of the discharge as a control variable.

Additionally, it is known from EP 0 795 623 A1 to determine the partial pressure of reactive gases with suitable probes. Thus, for example, the oxygen partial pressure measured with a lambda probe can be used as a control variable. Also, it is known from J. Affinito et al., J. Vac. Sci. Technol. A 2 (1984), p. 1275-1284, to control a magnetron sputtering source by measuring the plasma impedance. As a further possibility, the dissertation by J. Strümpfel, *Prozessstabilisierung beim reaktiven Hochratenzerstäuben mittels optischer Emissionsspektroskopie zur industriellen Herstellung von Indium-Zinn-Oxidschichten und Titandioxidschichten*, Chemnitz 1991, describes the measurement of the intensity of selected spectral lines of the plasma of the magnetron sputtering sources.

Furthermore, the deposition rate of a magnetron sputtering source that is operated in the unstable transition range is not absolutely known. As such, the layer thicknesses of the layers produced on the substrate have to be determined after deposition. Optical measurements such as photometry or ellipsometry are primarily used to this end.

The described expenditure in terms of equipment for each individual sputtering source of a coating system is necessary in order to ensure a constant layer quality, a constant layer structure and a constant layer thickness. This results in high costs in acquiring and operating the coating system, as well as in a high susceptibility to damage, particularly in large in-line systems.

The coating of steel band substrates or architectural glass is carried out in continuous process on an industrial scale with in-line systems of this type. Such coating systems have a large number of magnetron sputtering sources. Twenty to approximately thirty sources are typical; however, systems with up to sixty magnetron sputtering sources are also in use. Accordingly, what is critical for industrial production is the interaction of all of these individual sputtering sources, whereby several sources often deposit one and the same material. Only through very great expenditure is it possible for all the sources to supply identical results with respect to layer properties, coating rate and homogeneity.

An optical measurement of the layer properties after each sputtering source has proven to be extraordinarily difficult. Such methods are inapplicable in practice with overall systems having a plurality of optical measuring systems due to high costs and high susceptibility to damage.

SUMMARY OF THE INVENTION

Accordingly, the invention is directed to a sputtering source which, without monitoring of the deposited layer and without complex control loops, makes it possible to deposit layers with defined properties and with defined coating rates. Furthermore, the invention is directed to a sputtering source that has a higher coating rate compared to the prior art for high-refractive materials such as titanium dioxide.

In embodiments, there is a magnetron coating system including a first coating source, an auxiliary substrate arranged between the first coating source and an area that is provided for receiving a substrate to be coated, and a magnetron. The auxiliary substrate forms a cathode for this magnetron. Moreover, a device for determining the area density of the auxiliary substrate is included. In additional embodiments, the invention is directed to a method for depositing thin layers, in which a layer is deposited on an auxiliary substrate by a first coating source, the auxiliary substrate is used as a cathode for coating a substrate by a magnetron, and the area density of the auxiliary substrate is determined.

A magnetron coating system according to embodiments the invention comprises a first coating source, an auxiliary substrate, which is arranged between this first coating source and the area which is provided to receive the substrate to be coated, and a magnetron. A device is provided for determining the area density of this auxiliary substrate, and the auxiliary substrate forms a cathode for the referenced magnetron.

In implementations, to deposit a layer on a substrate, initially a layer is deposited with known deposit rate by the first coating source onto an auxiliary substrate. This auxiliary substrate now serves as a sputtering cathode for coating the substrate by the magnetron. Of course, not only the layer deposited on the auxiliary substrate can be removed, but also the material of the auxiliary substrate itself. In this case, both materials, optionally together with a component fed in a gaseous form, form the final layer on the substrate.

In further embodiments, after the determination of the area density of the auxiliary substrate, the area density of the substrate can be determined from the mass balance of the auxiliary substrate. The first coating source may comprise, for example, a planar magnetron, a linear ion source, which sputters a target or implants xenon or krypton, a linear source that is based on the principle of laser ablation, or a linear evaporation source.

In even further embodiments, the auxiliary substrate is preferably embodied as a rotating, cylindrical body. Those areas that are facing the first coating source can thus be provided with a coating continuously, while at the same time those area elements that are facing the substrate are continuously available as a sputtering cathode for coating the substrate. The auxiliary substrate is thus a component of a rod cathode magnetron. The cylindrical auxiliary substrate can be hollow in the interior area (i.e., tubular), or embodied as a solid rod. The material sputtered off by the first magnetron can be continuously transported to the substrate and deposited there through the rotation of the auxiliary substrate.

In a particularly advantageous embodiment, the first coating source is a planar magnetron. This first magnetron is thereby operated in a pure inert atmosphere. The coating rate can thus be determined absolutely from the known sputtering rate and from the electric discharge parameters.

When the second magnetron is operated with reactive gas or a mixture of inert and reactive gas, the coating rate of the substrate can be only inadequately quantified due to the constantly changing reactive gas partial pressure at this point. However, after the determination of the area density on the auxiliary substrate, the coating rate of the substrate can be determined absolutely from the mass balance of the auxiliary substrate.

In selected embodiments, the first coating source can be arranged in a shield in order to prevent the penetration of reactive gas components which would contaminate the coating source.

According to further aspects of the invention, the area density of the auxiliary substrate is determined by means of x-ray fluorescence. Overall, in this manner, the coating rate of the substrate can be determined with an error of less than 0.1%.

In embodiments, argon is suitable as inert gas for operating the first magnetron, such implementations being available without major technical effort and at low cost. Moreover, argon as an inert gas has a high ionization potential and remains inert even at high temperatures. Additionally, at least one of nitrogen, oxygen, and methane are suitable as a reactive gas. Thus, in combination with a metallic sputter target nitrides, oxides or carbides can be deposited as a thin layer on the substrate.

In embodiments, the metallic target comprises a metal layer of less than 100 nanometers, preferably a layer of less than 10 nanometers thick, deposited on the auxiliary substrate. It is known from S. Berg, J. Vac. Sci. Technol. A 10 (1992), p. 1592-1596, that the sputtering rate of materials with implanted heavy atoms is clearly higher compared to the sputtering rate of the pure material. Thus, with the magnetron coating system according to aspects of the invention, high deposition rates can be achieved even with operating conditions outside the transition mode. For materials with a high refractive index, such as, e.g., titanium dioxide, the device according to aspects of the invention allows the coating rate to increase by more than 50%.

In implementations, a particularly high increase in the coating rate results when the metal layer deposited by the first magnetron has a higher mass number than the average mass number of the material of the auxiliary substrate. Thus, for example, the sputtering rate of a 2 nm thick layer of tungsten on an auxiliary substrate of aluminum is greater (e.g., by up to a factor of 3) than the sputtering rate of a homogenous tungsten target.

In embodiments, the second magnetron can be operated as an individual magnetron with DC voltage or with pulsed DC voltage. Advantageously, a device according to a particular embodiment of the invention is operated as a double magnetron with an AC voltage of approximately 10 kHz to approximately 100 kHz, at a frequency of 40 kHz. With such operation as a double magnetron, two of the arrangements shown in FIG. 1 are connected to the poles of an AC source. Each auxiliary substrate is thus alternately switched as anode and cathode. An effective unification of the surfaces of the auxiliary substrates occurs through the alternating electron bombardment of the auxiliary substrates. This increases the process stability as desired. Furthermore, the operation of at least two auxiliary substrates as a double magnetron leads to a greater plasma density and thus to improved layer properties as desired.

The magnetron coating system according to the invention thus makes it possible for the first time to monitor the achievement of a predetermined layer thickness in a simple manner with the aid of the integral measuring technique. With the aid of this technology, even large in-line sputtering systems with a plurality of coating stations can be realized, which were not manageable with the control methods and optical diagnosis systems hitherto available.

According to a first aspect of the invention, there is a magnetron coating system comprising a first coating source and an auxiliary substrate arranged between the first coating source and an area into which a substrate to be coated is to be received. The system also includes a magnetron having a cathode composed of the auxiliary substrate and a device structured and arranged to determine an area density of the auxiliary substrate.

In embodiments, the auxiliary substrate is formed as a cylinder, and the magnetron comprises a rod cathode magnetron. Additionally, the first coating source may comprise a planar magnetron and a shield. Moreover, the device may comprise a detection device structured and arranged to determine x-ray fluorescence. Even further, the system may comprise additional auxiliary substrates, wherein the magnetron comprises additional cathodes composed of the additional auxiliary substrates.

According to a second aspect of the invention, there is a method for depositing thin layers. the method includes depositing a layer on an auxiliary substrate via a first coating source, coating a substrate via a magnetron having a cathode composed of the auxiliary substrate, and determining an area density of the auxiliary substrate.

In embodiments, a thickness of the layer deposited on the auxiliary substrate is less than 100 nm, and preferably less than 10 nm. Furthermore, the layer deposited on the auxiliary substrate may comprise a metal layer, such as an element having a higher mass number than an average mass number of a material of the auxiliary substrate.

Additionally, the method may further comprise operating the first coating source as an other magnetron with inert gas, and operating the magnetron with at least one of the inert gas and reactive gas. In such implementations, the inert gas comprises argon and/or the reactive gas comprises at least one of nitrogen, oxygen, and methane.

In further embodiments, the area density of the auxiliary substrate is determined after the coating of the substrate. Moreover, the determining of the area density of the auxiliary substrate may comprise x-ray fluorescence.

In even further embodiments, the method comprises operating the magnetron with DC voltage or pulsed DC voltage. Also, the cathode may comprise several cathodes and the method may further comprise operating the magnetron with the several cathodes with a frequency of approximately 10 kHz to approximately 100 kHz.

Additionally, the coating of the substrate may comprises depositing an other layer on the substrate. The other layer may comprise titanium dioxide.

BRIEF DESCRIPTION OF THE DRAWINGS

The invention is described below by way of example on the basis of one FIGURE, in which.

DETAILED DESCRIPTION OF THE PRESENT INVENTION

Figure 1:
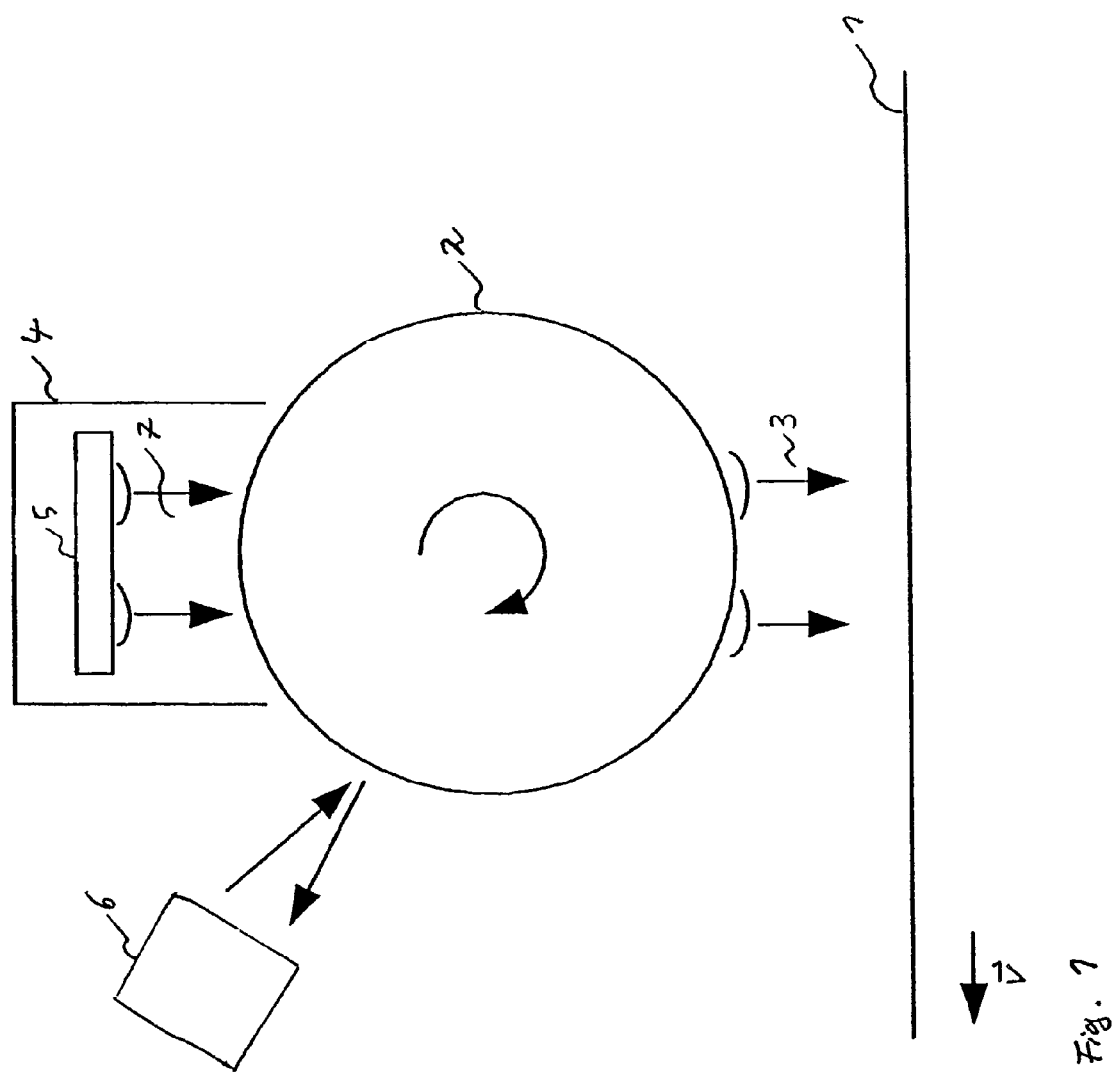
FIG. 1 shows the diagrammatic structure of a magnetron coating module according to the present invention.

The FIGURE shows a cylindrical auxiliary substrate 2 that rotates about its longitudinal axis. The substrate 1 to be coated is arranged below the cylindrical auxiliary substrate 2. This substrate 1 can be, e.g., architectural glass. The substrate 1 is moved through under the coating system. Plasma is ignited through a voltage applied to the auxiliary substrate 2, in the area 3 between the auxiliary substrate 2 and the substrate 1. The auxiliary substrate 2 thus forms a rod cathode from which material is sputtered off which coats the substrate 1 switched as an anode. A mixture of inert and reactive gas is located in the area 3, which permits the deposit of a multi-component layer. A planar magnetron 5 in a shield 4 is located on the opposite side of the auxiliary substrate 2. In this case, the auxiliary substrate 2 is switched as an anode that is coated with material of the planar sputtering cathode of the planar magnetron 5 in the plasma area 7. The gas phase in area 7 contains exclusively inert gas so that the deposition rate in area 7 can be determined from the known sputtering rates and the electric parameters. The coating rate on the substrate 1 results from the mass balance on the auxiliary substrate 2. In addition to the known coating rate in the area 7, the area density after the sputtering process in area 3 is determined. To this end, a device for determining the x-ray fluorescence 6 is located behind the area (i.e., plasma zone) 3. The device 6 thereby contains an x-ray source for irradiating the auxiliary substrate 2 and a photodetector for determining the x-ray radiation reflected from the auxiliary substrate.

The invention claimed is:

1. A magnetron coating system, comprising:
    a first coating source;
    an auxiliary substrate arranged between the first coating source and an area into which a substrate to be coated is to be received;
    a magnetron having a cathode composed of the auxiliary substrate; and
    a device structured and arranged to determine an area density of the auxiliary substrate, wherein:
        the device determines the area density of the auxiliary substrate at a location behind a plasma area between the auxiliary substrate and the substrate to be coated with respect to a direction of rotation of the auxiliary substrate,
        the location is before a plasma area between the first coating source and the auxiliary substrate with respect to the direction of rotation of the auxiliary substrate, and
        the device comprises an x-ray source that irradiates the auxiliary substrate at the location and a photodetector that determines x-ray radiation reflected from the auxiliary substrate.

2. The magnetron coating system according to claim 1, wherein the auxiliary substrate is formed as a cylinder, and the magnetron comprises a rod cathode magnetron.

3. The magnetron coating system according to claim 1, wherein the first coating source comprises a planar magnetron.

4. The magnetron coating system according to claim 1, wherein the first coating source comprises a shield.

5. The magnetron coating system according to claim 1, wherein the device comprises a detection device structured and arranged to determine x-ray fluorescence.

6. The magnetron coating system according to claim 1, further comprising additional auxiliary substrates, wherein the magnetron comprises additional cathodes composed of the additional auxiliary substrates.

7. A method for depositing thin layers, comprising:
    depositing a layer on an auxiliary substrate via a first coating source;
    coating a substrate via a magnetron having a cathode composed of the auxiliary substrate;
    determining an area density of the auxiliary substrate;
    determining a deposition rate in a plasma area between the first coating source and the auxiliary substrate; and
    after the determining the area density of the auxiliary substrate, determining an area density of the substrate from a mass balance of the auxiliary substrate.

8. The method of claim 7, wherein a thickness of the layer deposited on the auxiliary substrate is less than 100 nm.

9. The method of claim 8, wherein the thickness of the layer deposited on the auxiliary substrate is less than 10 nm.

10. The method of claim 7, wherein the layer deposited on the auxiliary substrate comprises a metal layer.

11. The method of claim 10, wherein the metal layer comprises an element having a higher mass number than an average mass number of a material of the auxiliary substrate.

12. The method of claim 7, further comprising:
    operating the first coating source as an other magnetron with inert gas; and
    operating the magnetron with at least one of the inert gas and reactive gas.

13. The method of claim 12, wherein at least one of the following:
    the inert gas comprises argon, and
    the reactive gas comprises at least one of nitrogen, oxygen, and methane.

14. The method of claim 7, wherein the area density of the auxiliary substrate is determined after the coating of the substrate.

15. The method of claim 7, wherein the determining of the area density of the auxiliary substrate comprises x-ray fluorescence.

16. The method of claim 7, further comprising operating the magnetron with DC voltage or pulsed DC voltage.

17. The method of claim 7, wherein the cathode comprises several cathodes and the method further comprises operating the magnetron with the several cathodes with a frequency of approximately 10 kHz to approximately 100 kHz.

18. The method of claim 7, wherein the coating of the substrate comprises depositing an other layer on the substrate.

19. The method of claim 18, wherein the other layer comprises titanium dioxide.

* * * * *